United States Patent [19]
Pyun

[11] Patent Number: 5,818,247
[45] Date of Patent: Oct. 6, 1998

[54] METHOD AND APPARATUS FOR TESTING INTERNAL CIRCUIT

[75] Inventor: Do-Sun Pyun, Seoul, Rep. of Korea

[73] Assignee: Daewoo Electronics Co., Ltd., Seoul, Rep. of Korea

[21] Appl. No.: 690,396

[22] Filed: Jul. 26, 1996

[30] Foreign Application Priority Data

Jul. 28, 1995 [KR] Rep. of Korea ................... 1995-22960

[51] Int. Cl.$^6$ ................................................. G01R 31/02
[52] U.S. Cl. .......................... 324/756; 324/754; 324/758; 324/761
[58] Field of Search ...................................... 324/537, 754, 324/756, 757, 758, 761

[56] References Cited

U.S. PATENT DOCUMENTS

| | | | |
|---|---|---|---|
| 5,030,907 | 7/1991 | Yih et al. | 324/754 |
| 5,399,975 | 3/1995 | Laing et al. | 324/537 |
| 5,408,189 | 4/1995 | Swart et al. | 324/758 |
| 5,469,064 | 11/1995 | Kerschner et al. | 324/537 |

*Primary Examiner*—Glenn W. Brown
*Attorney, Agent, or Firm*—Cushman Darby & Cushman IP Group of Pillsbury Madison & Sutro, LLP

[57] ABSTRACT

A method and an apparatus for testing an internal circuit reduces working hours and production cost for an electronic product using a multi-fixture. A measuring pointer of a printed circuit board is decided with computer aided design data stored in the control part, and when the CAD data is not available, the measuring pointer of the printed circuit board can be programmed by sensing the pressure values for a printed circuit board with a pressure sensor. The amount of time spent when producing an electronic product using a multi-fixture is reduced and the productivity of the product by providing a product with a measuring section for measuring pointer for various models of the printed circuit board is improved. Further, the production cost of an electronic product is reduced because the test can be performed without manufacturing special fixtures. The space application is improved since the storing space of the special fixture is saved.

20 Claims, 7 Drawing Sheets

METHOD AND APPARATUS FOR TESTING INTERNAL CIRCUIT

BACKGROUND OF THE INVENTION

1. Field of the Invention

The present invention relates to a method and an apparatus for testing an internal circuit. More particularly, the present invention relates to a method and an apparatus for testing an internal circuit capable of reducing working hours and production cost for an electronic product using a multi-fixture.

2. Description of the Prior Art

An internal circuit is used for connecting a number of parts in order to attain an operation of a device that performs the operation. A printed circuit board is comprised of several electronic components, which are integrated on a small panel. The greatest distribution of the electronic components is manufactured by a printing method. Currently, printed circuit boards of a single pattern contain a high density of electronic component in order to miniature the size of both faces of the board. Because electronic machines tend to be popular, printed circuit boards with a single pattern have been manufactured in large quantities at one time.

An internal circuit tester is used for testing several problems, such as whether or not an electronic machine circuit is exactly mounted on the printed circuit board, whether or not the circuit thereon is correctly printed, and whether or not the electronic circuit itself has degraded. In order to test the problems as mentioned previously, a special fixture suitable for each printed circuit board is used. Therefore, after testing a printed circuit board, a worker must replace the tested printed circuit board with a new printed circuit board and again set a new test program for testing the next printed circuit board.

Figure 1:
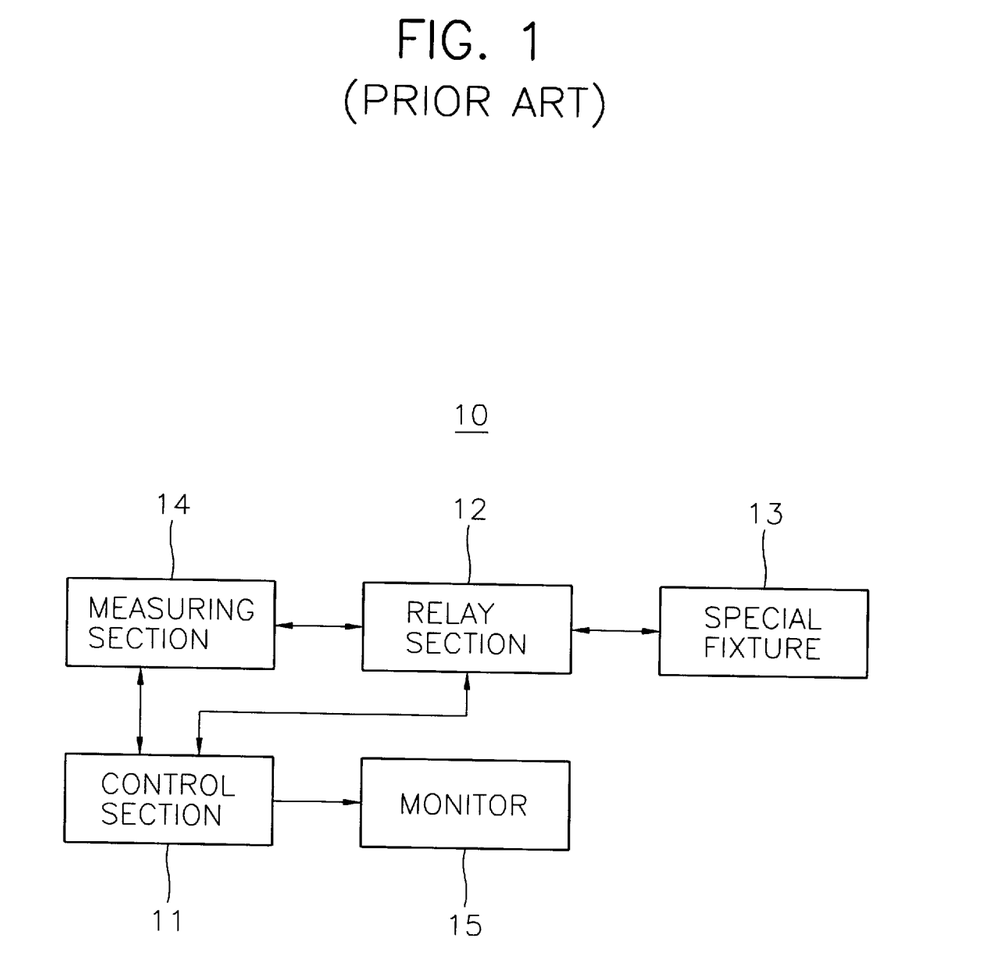
FIG. 1 is a block diagram for showing a configuration of a conventional internal circuit tester.

Hereinafter, a configuration and operation of the conventional internal circuit tester 10 will be described with reference to the accompanied drawings. FIG. 1 shows a configuration of a conventional internal circuit tester. The conventional internal circuit tester includes a control section 11, a relay section 12, a special fixture 13, a measuring section 14, and a monitor 15.

Figure 2:
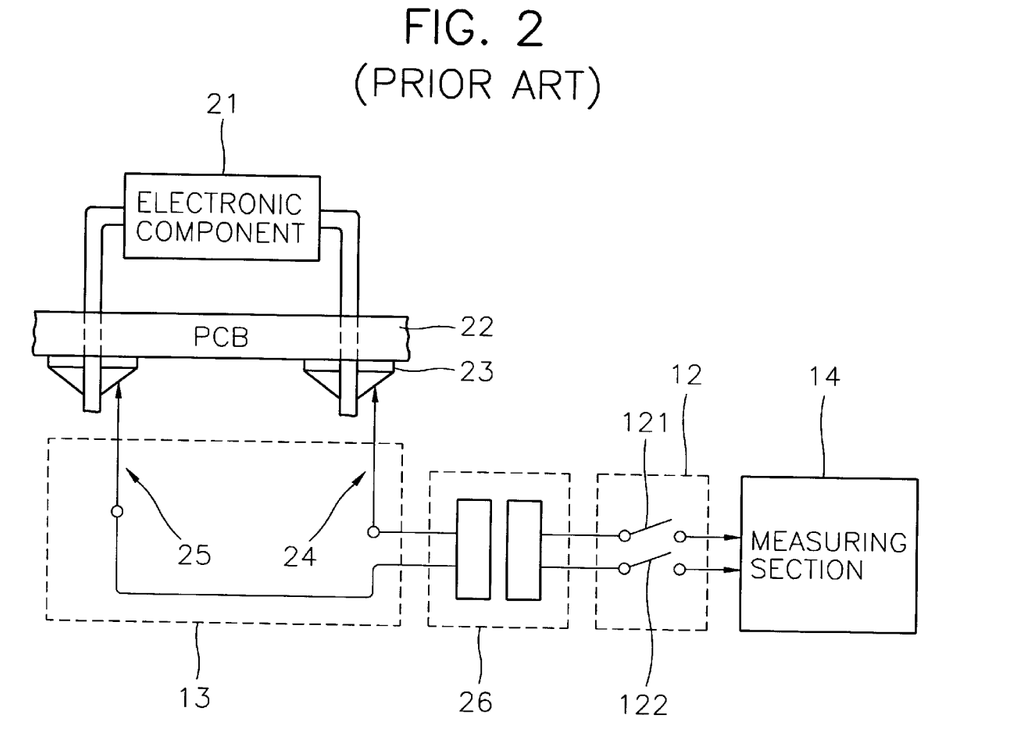
FIG. 2 is a circuitry diagram for showing the internal circuit tester shown in FIG. 1.

Control section 11 converts the feedbacked test value into a digital value and outputs the digital value into measuring section 14 by sequentially driving measuring circuits (not shown) included in measuring section 14 and the corresponding relay from relay section 12 by means of measuring programs existing therein, in order to display the value on monitor 15. Relay section 12 includes a plurality of relays, which are connected to tester pins 24 and 25 of special fixture 13 in one-to-one manner. Measuring section 14 reads a voltage passing through relay section 12 using an analog-digital (A/D) converter (not shown) located therein, converts the read voltage into a digital value, and transmit the digital value to control section 11. Measuring section 14 also receives a control signal from control section 11 and transmits the received control signal to necessary parts of a printed circuit board 22 (FIG. 2). Measuring section 14 also serves to control a digital-analog (D/A) converter (not shown) located therein, in order to apply a necessary voltage to an internal measuring circuit under the control of control section 11. Monitor 15 serves as a display for the programs of control section 11.

FIG. 2 is a circuitry diagram for showing internal circuit tester 10 shown in FIG. 1. The conventional internal circuit tester 10 serves to check the efficiency of a printed circuit board 22 having an electronic component 21, due to incorrect insertion, a reverse insertion, or a non-insertion of electronic component 21, and to check for a decline in efficiency due to a brazing of electronic parts 21 during soldering. In order to perform the above-mentioned roles, tester pins 24 and 25 are installed on a land (or a pad) 23 in which soldered electronic component 21 of printed circuit board 22 are inserted. A special fixture 13, which comprises collecting tester pins 24 and 25, is connected to a connector 26 through a wire, and to relay section 12 through connector 26.

A principle of measuring efficiency of electronic component 21 mounted on printed circuit board 22, is described as follows. At first, control section 11 sequentially drives a measuring circuit included in measuring section 14 by using test programs located therein. Accordingly, measuring section 14 applies a predetermined voltage, that is a reference voltage 2.5 volts for electronic parts 21, to electronic component 21 through relay section 12, connector 26, and printed circuit board 22. Relay section 12 turns-on a first relay 121 to apply the applied 2.5 volts voltage to electronic component 21. At the same time, relay section 12 also turns on a second relay 122 so that the voltage passing through electronic parts 21 is feedbacked to measuring section 14. Then, control section 11 calculates a measured value of electronic parts 21 according to a drop in the voltage passing through electronic parts 21, so that it judges whether the electronic component 21 is of superior or inferior quality according to a permitted set value. That is, control section 11 compares the measured value of electronic component 21 with a reference value indicative of electrical components (superior goods) having a normal value, and displays on monitor 15 whether or not electronic parts is good according as whether or not the measured value is at or above the reference value.

When a product model is changed, a worker should separate the used special fixture 13 from printed circuit board 22 and install a new special fixture suitable for the next model. Then, the worker performs a debugging operation for test programs are stored in control section 11 by a superior board according to the change of the special fixture. When the special fixture and the test programs are changed completely, the following production operation starts.

Figure 3:
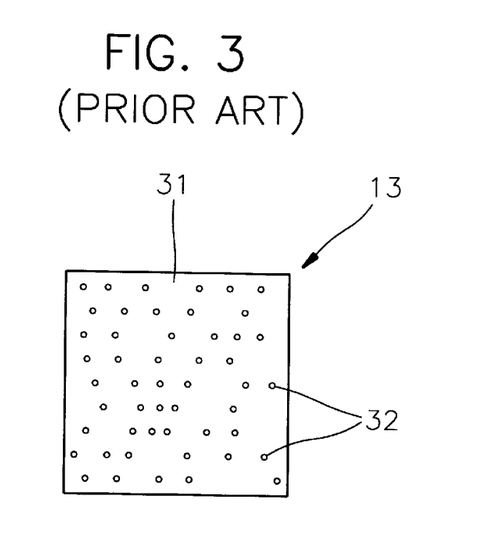
FIG. 3 is a schematic view for showing an example of the special fixture shown in FIGS. 1 and 2.

FIG. 3 schematically shows the special fixture 13 shown in FIGS. 1 and 2. The conventional special fixture 13 includes a body 31 and a plurality of tester pins 32, and measuring section 43 to measure a model of printed circuit board 22 having an electronic component 21 mounted thereon. The measuring method has the following steps. As tester pins 24 and 25 contact a land 23 on printed circuit board 22, measuring section 14 applies a reference voltage to electronic parts 21, abstracts the feedbacked voltage from tester pins 24 and 25, and receives the feedbacked voltage through second relay 122 of relay section 12. Measuring section 14 converts the received feedbacked voltage into a digital value by means of an analog-digital (A/D) converter (not shown) therein and transmits the digital value to control section 11. As noted above, a special fixture can be used for only a decided electronic model. When the model is changed during the production process, a special fixture suitable for a printed circuit board of the changed model is manufactured and used.

As mentioned previously, in the conventional method, since the test is performed by using a special fixture in order to test whether or not a printed circuit board is degraded, when the produced model is changed, a worker must manufacture a new special fixture in accordance with the printed circuit board and replace the used printed circuit board by installing the new printed circuit board in the internal circuit tester. Accordingly, in the conventional methods, mistakes can occur when connecting or disconnecting wires, excess time is spent on replacing a used special fixture with a new special fixture, an excessively large separated space is needed enough to hold various special fixtures, a wider space is needed if there are various electronic products, and the tester must be abandoned when a manufactured electronic machine is sold out. Therefore, one disadvantage of the conventional tester is that because a large amount of time is wasted in frequently replacing the special fixture and changing the test programs, so there is a decrease in work efficiency and productivity. Further, because a special fixture must be separately manufactured, the production cost is high.

U.S. Pat. No. 5,399,975, (issued to Mark A. Laing and Robert J. Williams on Mar. 21, 1995) may be given as one example of a method and an apparatus for testing an internal circuit. U.S. Pat. No. 5,399,975 has a configuration capable of testing the electrical conductivity of a connection between an integrated circuit device and a circuit board to which the device is connected. U.S. Pat. No. 5,408,189, (issued to Mark A. Swart, Charles J. Johnson and David R. Van Loan on Apr. 18, 1995) may be given as another example of a method and an apparatus for testing an internal circuit. U.S. Pat. No. 5,408,189 has a configuration capable of accurately positioning a printed circuit board on a test fixture so that a pattern of test points in a circuit array printed on the board is precisely registered with an array of corresponding test probes on the fixture. But both U.S. Pat. Nos. 5,399,975 and 5,408,189 fail to solve the conventional disadvantages that a large amount of time is wasted in frequently replacing the special fixture and changing the test programs, so that there is a decrease in work efficiency and productivity. Further, because a special fixture must be separately manufactured, the production cost is high.

SUMMARY OF THE INVENTION

Therefore, a first object of the present invention is to provide a method for testing an internal circuit capable of reducing the amount of time spent manufacturing the electronic product and the production cost for the electronic product.

A second object of the present invention is to provide an apparatus for testing an internal circuit capable of reducing the amount of time spent manufacturing the electronic product and the production cost for the electronic product.

In order to achieve the above first object, the present invention provides a method for testing an internal circuit, the method comprising the steps of:

a) storing in a control means reference values and set allowable values for a plurality of electronic components;

b) judging whether or not computer aided design data including component information data and component position data for the electronic components installed in a printed circuit board, are stored in the control means;

c) when it is judged that the computer aided design data are stored in the control means in the step b), positioning tester pins of a multi-fixture in the electronic component by using the component position data of the computer aided design data, and judging a point where a solder pointer of the printed circuit board and a measuring pointer of the multi-fixture cross each other;

d) when it is judged that the computer aided design data are not stored in the control means in the step b), calculating the pressure of each pointer in the printed circuit board, and judging which section is a solder of the printed circuit board and which section is a lead of the electronic component according to whether the calculated pressure is relatively high or low;

e) storing a first measured pointer data according to the point judged in the step c) where the solder pointer of the printed circuit board and the measured pointer of the multi-fixture cross each other, storing a second measured pointer data according to the section judged in the step d) to be the solder of the printed circuit board, and storing a third measured pointer data according to the section judged in the step d) to be the lead of the electronic component;

f) loading the first, second, and third measured pointer data stored in the control means, and measuring the printed circuit board with the electronic components mounted thereon, in order to achieve a measurement result; and g) judging whether or not a total area of the printed circuit board is measured completely, when the total area of the printed circuit board is not measured completely, moving the multi-fixture into a next area of the printed circuit board, to return to the step f), and when the total area of the printed circuit board is measured completely, comparing a measured result achieved in the step f) with the reference value stored in the control means in the step a), in order to decide whether or not the electronic component has degraded. At this time, the computer aided design data includes the component information data, the component position data, pattern data, solder mask data for the all sorts of electronic components. The pressure of the lead of the electronic component is preferably higher than that of the solder of the printed circuit board. The operation of measuring the printed circuit board with the electronic component is mounted thereon in the step f) may be performed by applying a measured reference voltage to the electronic component; feedbacking the voltage passing through electronic component; and comparing the feedbacked voltage with a reference value stored in the control means, and displaying whether or not the electronic component is good according to whether or not it is at or above the permitted set value stored in the control means. Preferably, the step g) further includes the substep of displaying a result of the testing operation of whether or not the electronic component has degraded after deciding whether or not the electronic component has degraded.

In order to achieve the second object, the present invention also provides an apparatus for testing an internal circuit, the apparatus comprising:

a multi-fixture including a plurality of tester pins having the same size, which are installed at a uniform interval apart from each other, and which move along at least one printed circuit board on which at least one electronic component is mounted;

a motor for controlling a position change of the multi-fixture so that the multi-fixture moves along at least one printed circuit board;

a first means for selecting a plurality of measuring modes, respectively relating to the resistance, the capacitance, the inductance, and the reactance for the at least one electronic component, for applying a measuring reference voltage to the at least one electronic component, and for outputting a voltage feedbacked from the at least one electronic component;

a second means including at least one switch connected to the tester pins of the multi-fixture for switching in order to apply the measuring reference voltage from the first means to the electronic component, and to apply a feedbacked voltage of the applied measuring reference voltage from the electronic component to the first means;

a pressure sensor for calculating which section is a solder of the printed circuit and which section is a lead of the electronic component;

third means for storing reference values and a set allowable values for a plurality of electronic components, for selectively storing computer aided design data having component information data and component position data of the electronic component therein, for controlling the first means so that the first means can select the measuring modes of the electronic components for judging which section is the solder of the printed circuit board and which section is the lead of the electronic component according to whether the sensed pressure from the pressure sensor is relatively high or low, for using the judged measured pointers and controlling the first means so that the first means can measure the electronic component, for comparing the resulting voltage values measured by the first means with the reference values stored therein to judge whether or not the electronic component has degraded according to whether the value is at or above the stored set allowable value therein, and for controlling a switching operation of the second means and an operation of the motor; and a displaying device for displaying the resulting measured data judged by the third means. Here, the multi-fixture moves in X and Y axial directions so that the first means measures at least one printed circuit board. The multi-fixture may further include a plurality of springs installed around the tester pins in order to absorb shocks when the tester pins make contact with the printed circuit board. Preferably, the first means includes an analog-digital converter for converting the received feedbacked voltage from the electronic component into a digital value. The third means may further include a motor controlling section for controlling a speed of the motor using a motor controlling programs therein.

In the method and apparatus for testing an internal circuit according to the present invention, the measuring pointer of the printed circuit board is decided by means of computer aided design data stored in the control part, and when the CAD data is not available, the measuring pointer of the printed circuit board can be programmed by sensing pressure values for the printed circuit board by means of the pressure sensor.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

A description will be given below in detail, with reference to the accompanying drawings, of the mechanical structure, the circuitry configuration, and the operation of a method and an apparatus for testing an internal circuit according to one embodiment of the present invention.

Figure 4:
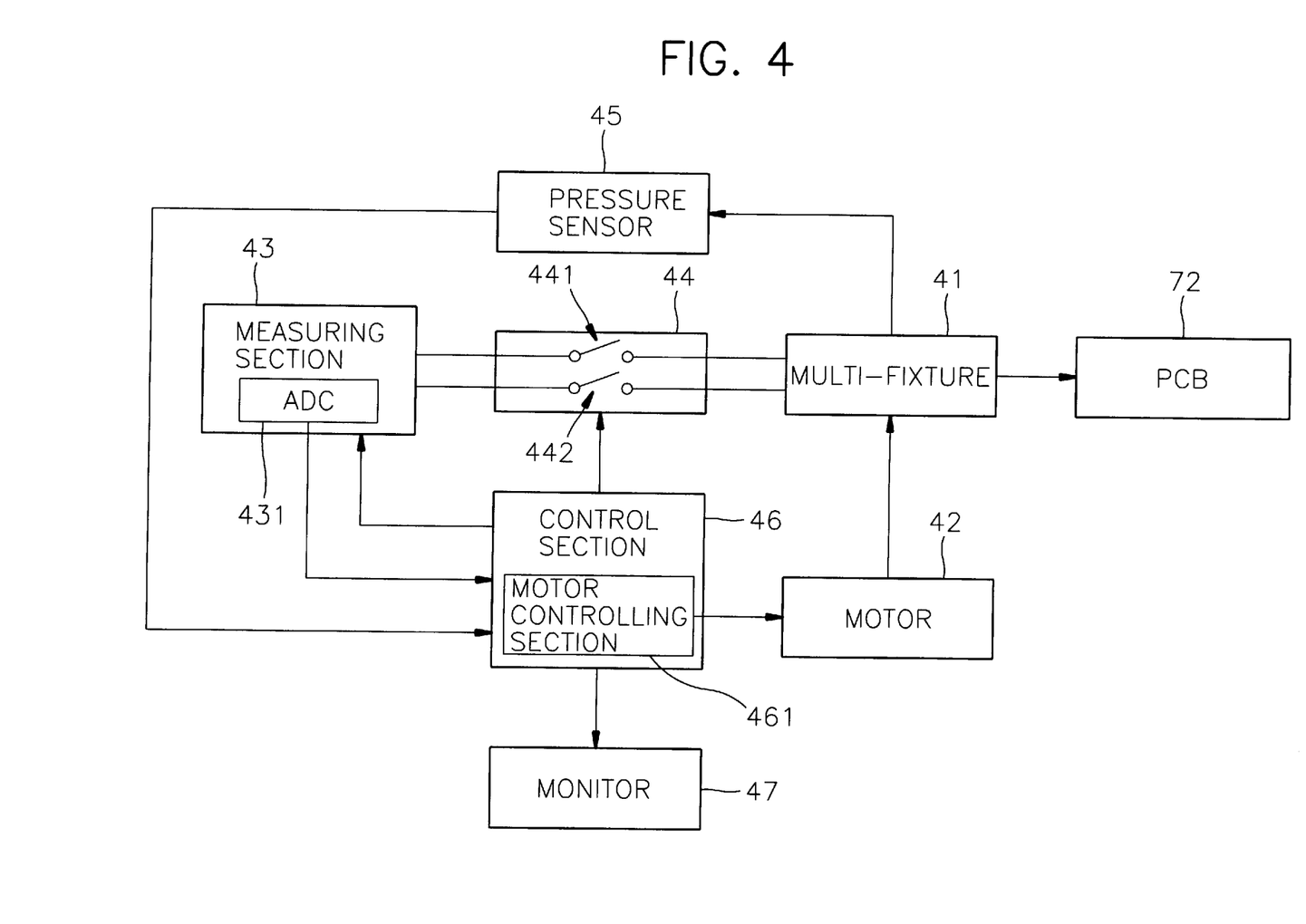
FIG. 4 is a block diagram for illustrating the configuration of an apparatus for testing an internal circuit according to one embodiment of the present invention.

FIG. 4 illustrates the configuration of an apparatus 40 for testing an internal circuit according to one embodiment of the present invention. Apparatus 40 for testing an internal circuit according to the present invention includes a multi-fixture 41, a motor 42, a measuring section 43, a switch section 44, a pressure sensor 45, a control section 46, and a monitor 47.

Figure 5:
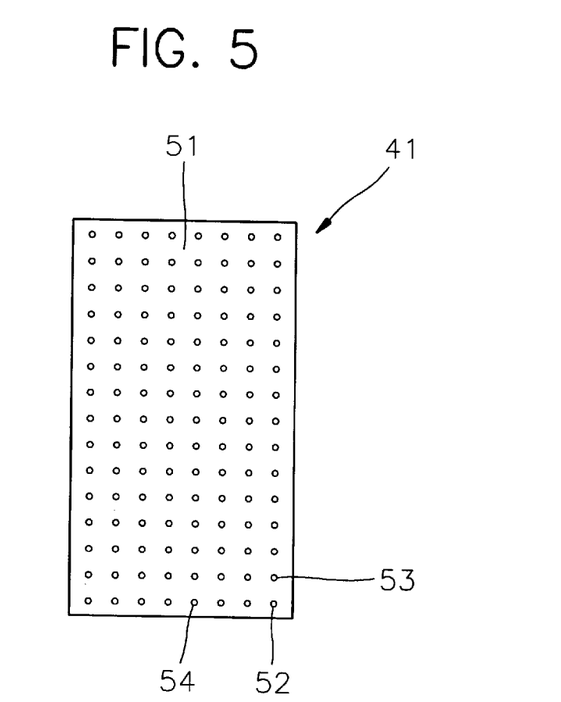
FIG. 5 is a plan diagram for showing the multi fixture shown in FIG. 4.
Figure 6:
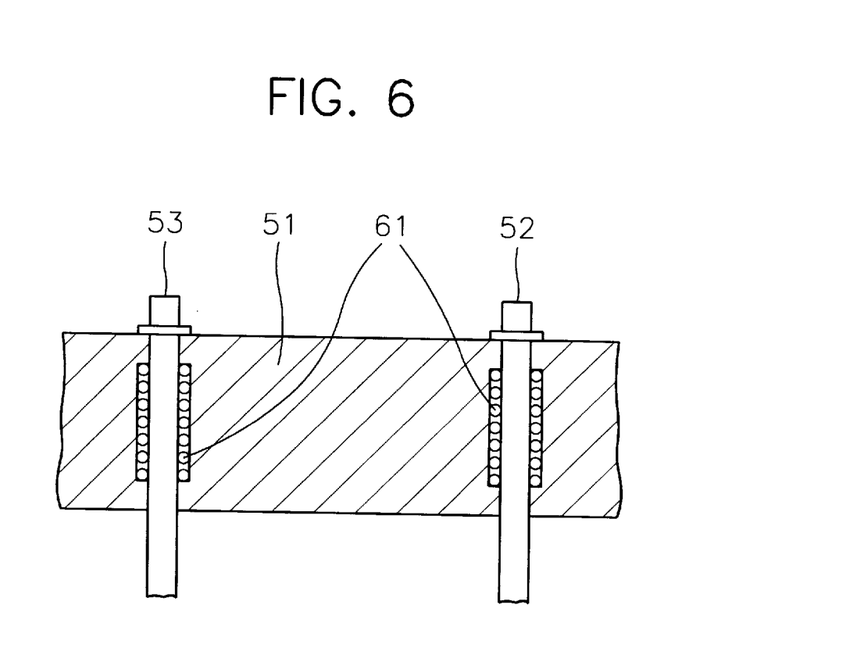
FIG. 6 is a sectional view for showing the multi fixture shown in FIG. 5.

FIG. 5 is a plan diagram showing an example of the multi-fixture 41 shown in FIG. 4 and FIG. 6 is a sectional view showing the multi-fixture shown in FIG. 5. Multi-fixture 41 includes a body 51 and a plurality of tester pins 52, 53 and 54 of the same size, formed at a constant interval apart from each other in a side of body 51, and move in the X and Y axial directions so that measuring section 43 measures at least one printed circuit board 72 having at least one electronic component 71 mounted thereon. Tester pins 52, 53 and 54 are electrical conductors that input a measuring reference voltage 2.5 volts to electronic component 71 through a first switch 441 of switch section 44 and output the measured point signal from electronic component 71 to measuring section 43. As shown in FIG. 6, multi-fixture 41 further includes a spring 61 installed around tester pins 52, 53 and 54. Spring 61 absorbs shocks that occur when tester pins 52, 53 and 54 contact printed circuit board 71. Since multi-fixture 41 has a uniform size, when printed circuit board 72 is larger than multi-fixture 41, multi-fixture 41 is moved from one portion of printed circuit board 72 to another portion thereof by a rotation of motor 42 in order that the measuring operation can be carried out. Here, motor 42 is controlled by a program included in control section 46. As mentioned above, multi-fixture 41 moves several times one portion to another portion of printed circuit board 72 to cover the total area thereof, so that the operation for measuring the measuring points is achieved.

As motor 42 rotates multi-fixture 41, motor 42 controls the position change of multi-fixture 41 so that multi-fixture 41 moves along a corresponding measuring printed circuit board among at least one printed circuit board. Motor 42 includes a stepping motor rotating as much as an angle in proportion to pulse numbers by applying a pulse signal as a pressure. Measuring section 43 selects measuring modes such as a resistance, a capacitance, a reactance, and an inductance, applies a measuring reference voltage 2.5 volts to electronic component 71, converts a voltage feedbacked from electronic component 71 into a digital value, and outputs the digital value to control section 46. Further, measuring section 43 includes an analog-digital converter 431 for converting the feedbacked voltage from electronic component 71 into a digital value. Switch section 44 includes a plurality of switches, connected to tester pins 52, 53 and 54 of multi-fixture 41, which switch to apply a measuring reference voltage 2.5 volts from measuring section 43 to electronic component 71, and uses the applied measuring reference voltage from electronic component 71 to apply a feedbacked voltage to measuring section 43. The switches are formed by a complementary metal-oxide semiconductor transistor, which is low in power consumption, good in durability and cheap to produce.

Figure 7:
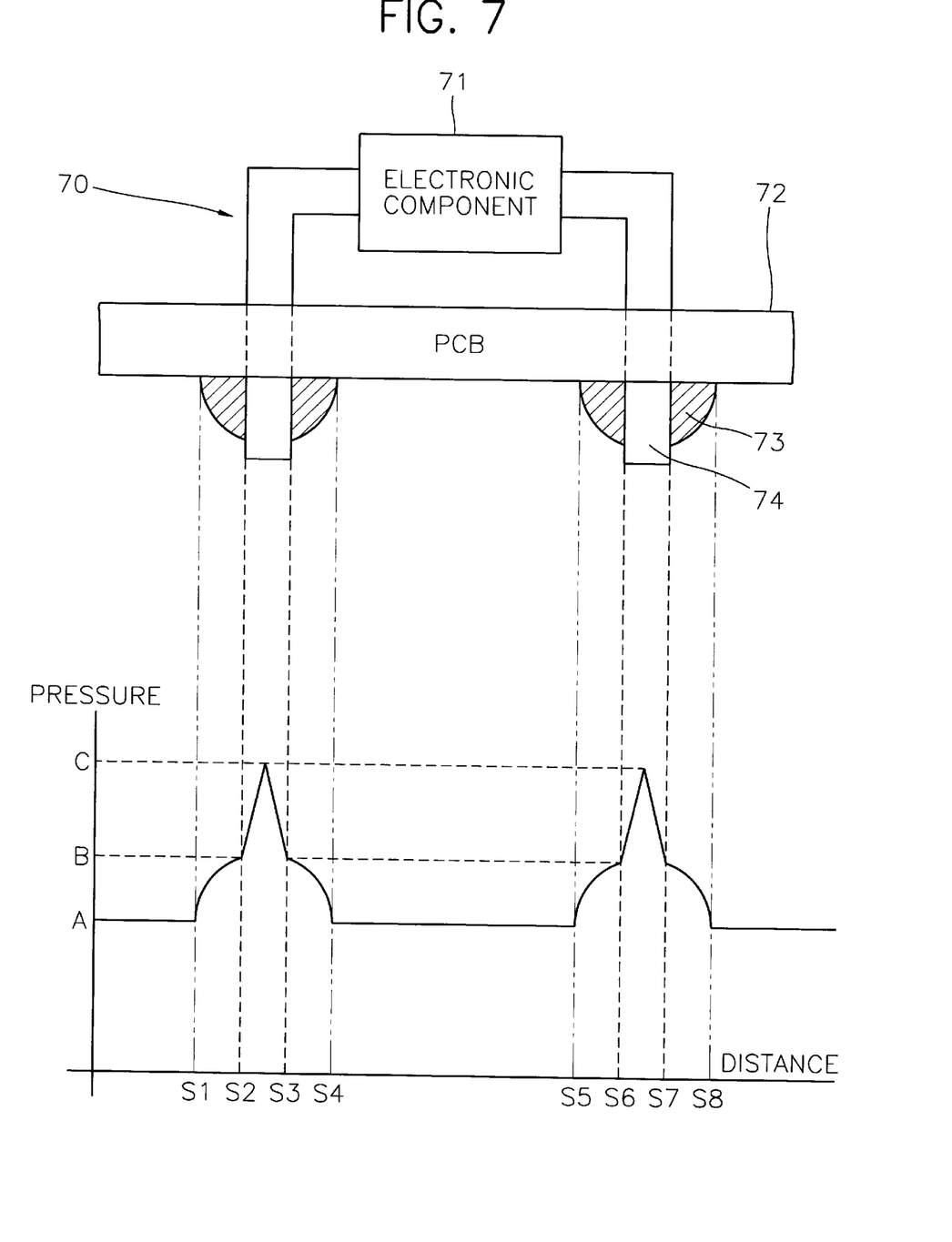
FIG. 7 is a graph for illustrating how the pressure sensor in FIG. 4 judges measured points.

FIG. 7 is a graph for illustrating how pressure sensor 45 in FIG. 4 judges measured points. Pressure sensor 45 calculates pressure values for both a solder 73 of printed circuit board 72 and a lead 74 of electronic component 71 and outputs the calculated pressure values to control section 46 under a control of control section 46. In order to recognize whether electronic component 71 has been installed, pressure sensor 45 senses pressure values of both solder 73 formed below printed circuit board 72 and lead 74 of electronic component 71, and outputs the sensed pressure values to control section 46. Control section 46 judges whether areas S1~S2, S3~S4, S5~S6, and S7~S8, which indicate a lower pressure of A→B, are solder 73 of printed circuit board 72, and whether areas S2~S3 and S6~S7, which indicate a higher pressure of B→C, are lead 74 of electronic component 71 according to whether the sensed pressure from pressure sensor 45 is relatively high or low. Also, control section 46 outputs the judged results to monitor 47 so that the judged pressure values for solder 73 of printed circuit board 72 and for lead 74 of electronic component 71, are displayed in the form of a graph on monitor 47. The graph represents the measured results in a ratio of a pressure value to a distance. As shown in FIG. 7, lead 74 of electronic component 71 outputs a peak value than in solder 73, while solder 73 of printed circuit board 72 outputs an easy slope value. Accordingly, a worker can easily recognize whether electronic component 71 has been installed.

Control section 46 stores reference values and set allowable values for a plurality of electronic components, selectively stores computer aided design (CAD) data therein, selects the measuring modes of electronic component 71, judges solder 73 of printed circuit board 72 and lead 74 of electronic component 71 according to whether the sensed pressure from pressure sensor 45 is relatively high or low, and controls an operation of electronic component 71 so that measuring section 43 can measure electronic component 71, which uses measuring pointers according to the judgement.

Further, control section 46 compares the resulting measured values from measuring section 43 with the reference values stored therein to judge whether or not electronic component 71 has degraded according to a set allowable value, that is, judges whether or not electronic component 71 has degraded and whether or not if it has errors according to whether or not the measured pressure value is higher or lower than a reference value. Control section 46 controls an operation of switch section 44 and controls an operation of motor 42. Control section 46 further includes a motor controlling section 461 for controlling a speed of motor 42 by a motor controlling program stored therein. In the CAD data, measuring point data means a position value of electronic component 71. That is, measuring point data is a position value that indicates what distances from a reference point on printed circuit board 72 in the X and Y axial directions measured electronic component 71 is located and equal to numerical control (NC) data.

Generally, the CAD data includes a variety of data, such as, component data, pattern data, solder mask data, component information (BOM) data, and NC drill data. Whether or not pressure sensor 45 is used is decided according to whether or not the CAD data is stored in control section 46. That is, control section 46 uses the CAD data where multi-fixture 41 can search a position of electronic component 71 according to a program order by matching CAD data stored therein with the component information data so that measuring section 43 can perform a measuring operation of electronic component 71. In other words, assuming that the measured order of programs stored in control section 46 is R111→C128→R102→D28 . . . , control section 46 reads out of the stored programs therein, drives stepping motor 42 to move tester pins 52, 53, and 54 into printed circuit board 72, where electronic component 71 is located, reads out the component information data having all informations of electronic component 71 to be measured, and displays the information on monitor 47. Control section 46 judges whether electronic component 71 is superior or inferior quality by comparing the measured results beside the displayed component information data on monitor 47.

Monitor 47 displays the measured result data under control of control section 46. An internal circuit 70 is the circuitry connecting relationship of electronic component 71 and printed circuit board 72.

Figure 8A:
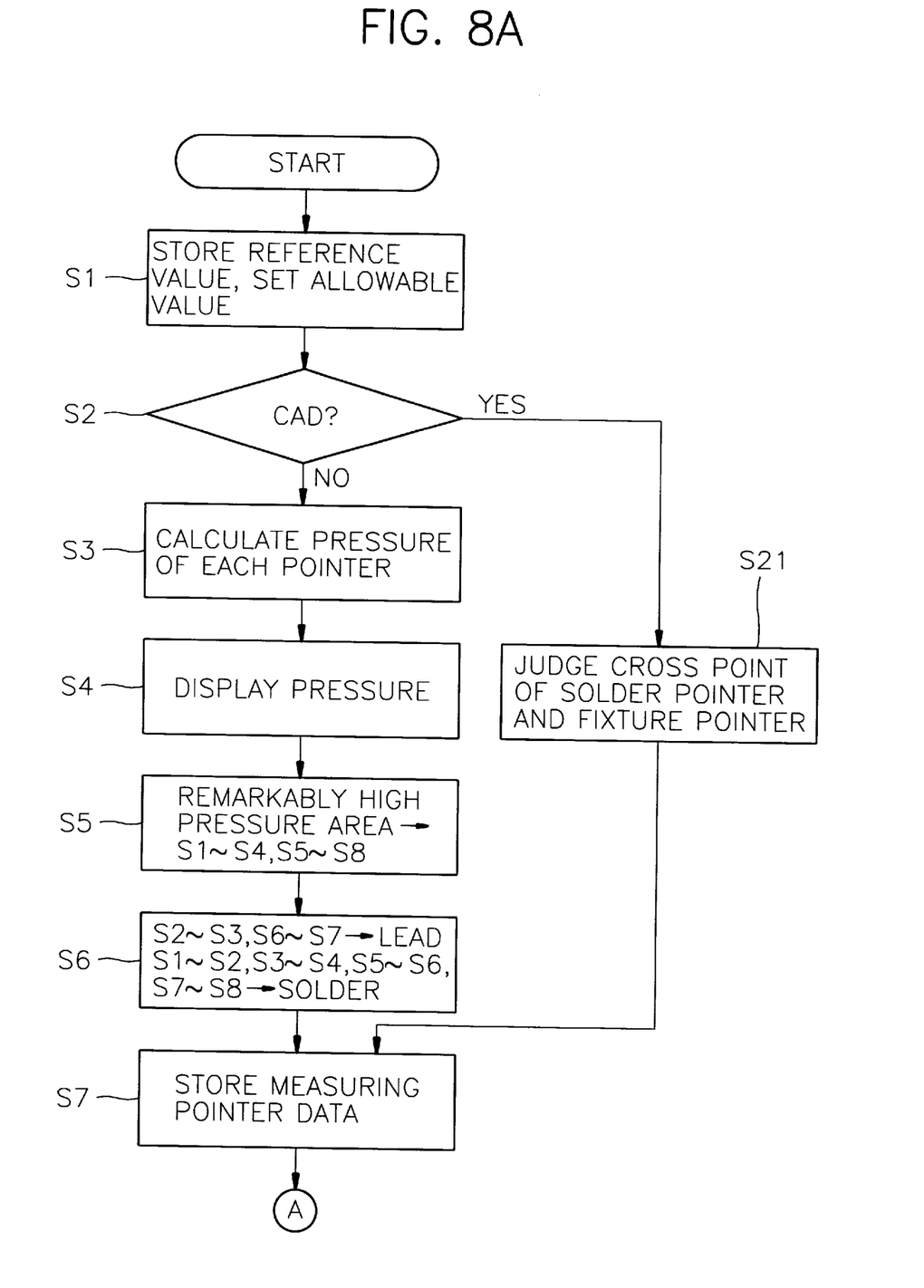
FIGS. 8A and 8B are a flow chart for illustrating a method for testing an internal circuit according to one embodiment of the present invention.
Figure 8B:
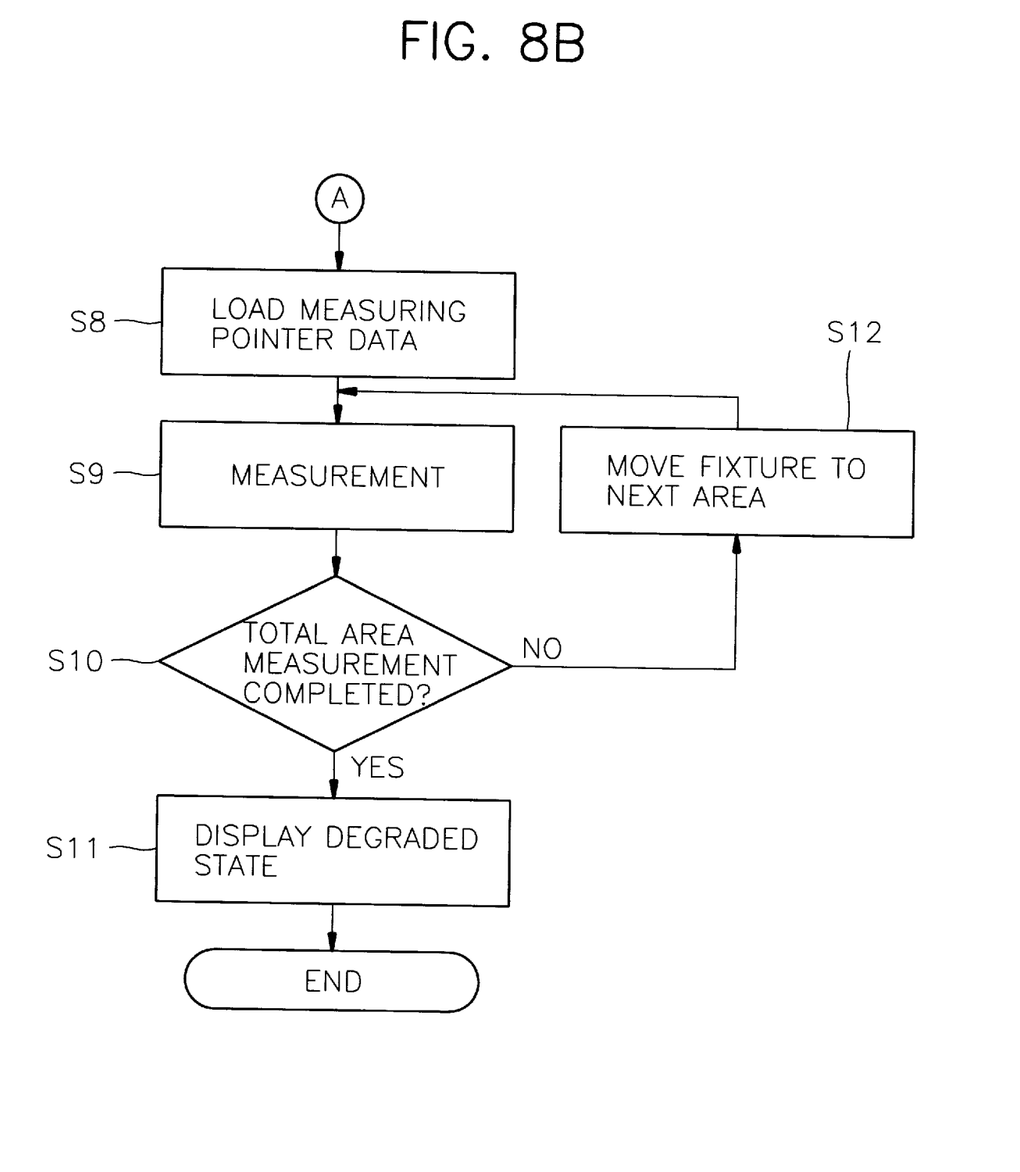

The operation of an apparatus and a method for testing an internal circuit is described as follows with reference to FIGS. 8A and 8B. FIGS. 8A and 8B are a flow chart for illustrating a method for testing an internal circuit according to one embodiment of the present invention. Assuming that a measuring order for electronic components of programs stored in control section 46 is R111→C128→R102→D28 . . . . In step S1, control section 46 stores reference values and set allowable values for a plurality of electronic components. In step S2, control section 46 judges whether CAD data including the component information (bom of material; BOM) data and component position data for electronic component 71 are present therein. The component position data indicates the distance of electronic component 71 from a reference point on printed circuit board 72 in the X and Y axial directions.

As a result of the judgement in step S2, when the CAD data are present in control section 46, motor controlling section 461 of control section 46 drives stepping motor 42 so that tester pins 52, 53 and 54 of multi-fixture 41 can be moved into electronic component 71. Then, control section 46 judges a point where solder pointer of printed circuit board 72 and measuring pointer of multi-fixture 41 cross each other, by using the component position data of CAD data (step S21). However, as a result of the judgement in step S2, when the CAD data are not present in control section 46, control section 46 controls pressure sensor 45 to calculate pressures for each pointer in the printed circuit board 72 on which electronic component 71 is mounted. That pressure sensor 45 calculates pressures for lead 74 of electronic component 71 and solder 73 of printed circuit board 72 (step S3).

Then, control section 46 controls monitor 47 to display the calculated pressure values by pressure sensor 45 in the form of a graph (step S4). At the same time, control section 46 decides which areas S1~S4 and S5~S8 (FIG. 7) have remarkably high pressure values by the pressure values displayed on monitor 47 (step S5). Then, control section 46 decides pointers where the pressure is abruptly increased in the decided areas as a lead 64 of electronic machine circuit 62, and decides all other measuring pointers S1~S2, S3~S4, S5~S6, and S7~S8, except for the pointers of lead 64, is solder 73 of printed circuit board 72 (step S6).

As stated above, after completing step S2 for judging where solder pointer of printed circuit board 72 and measuring pointer of multi-fixture 41 cross each other, and completing step S6 of deciding which is lead 74 of electronic component 71 and which is solder 73 of printed circuit board 72, control section 46 stores a first measuring pointer data for a point which solder pointer of printed circuit board 72 and measuring pointer of multi-fixture 41, a second measuring pointer data for solder 73 of printed circuit board 72, and a third measuring pointer data for lead 74 of electronic component 71 therein (step S7).

Then, control section 46 loads the stored measuring pointer data, that is, first, second, and third measuring pointer data therein, in step S8. In other words, control section 46 reads out the component information data and NC drill data among the CAD data of the registered files therein. Then, control section 46 reads out the information data and the position information for electronic component 71 from programs stored therein, and drives stepping motor 42 to move multi-fixture 41 into a position corresponding to the position information data of electronic component 71, in order that measuring section 43 can perform a measuring operation in step S9.

The measuring operation in step S9 is as follows. Control section 46 sequentially drives a measuring circuits (not shown), which is included in measuring section 43, using measuring programs located therein. Accordingly, measuring section 46 applies a predetermined voltage, that is, a reference voltage 2.5 volts for electronic component 71, to electronic component 71 through switch section 44, multi-fixture 41 and lead 74, switch section 44 turns-on a first switch 441 to apply the applied 2.5 volts to electronic component 71. At the same time, switch section 44 also turns-on a second switch 442, so that the voltage passing through electronic component 71 is feedbacked to measuring section 43. Then, control section 46 calculates a measured value of electronic component 71 according to a drop in the voltage passing through electronic component 71. Control section 46 then judges whether electronic component 71 is superior or inferior according to whether it is at or above a permitted set value. Moreover, control section 46 compares the measured value of electronic component 71 with a reference value of electrical components (superior goods) having a normal value and displays whether or not electronic component is good on monitor 47. The efficiency test for electronic component 71 is carried in the order of R111→C128→R102→D28 . . . .

Then, control section 46 judges whether or not the total area of printed circuit board 72 is measured completely in step S10. As a result of the judgement in step S10, when the total area of printed circuit board 72 has not been measured completely, control section 46 controls stepping motor 42 to change the position of multi-fixture 41 by moving it right and left into another area (step S12). Then, step S9 is performed again. However, as a result of the judgement in step S10, when the total area of printed circuit board 72 has been measured completely, control section 46 compares the measured results achieved in step S9 with the reference value of superior goods stored in control section 46 in step S1, judges whether or not electronic component 71 has degraded according to the set allowable value, and displays information about a degraded state on monitor 47 (step S11).

In the method and apparatus for testing an internal circuit according to the present invention, the measuring pointer of the printed circuit board is decided by means of computer aided design data stored in the control part, and when the CAD data is not available, the measuring pointer of the printed circuit board can be programmed by sensing pressure values for the printed circuit board by means of the pressure sensor. Also, the present invention reduces the amount of time spent producing an electronic product using a multi-fixture and improves the productivity of the product by providing the product with a measuring section that can measure the measuring pointers for various models of the printed circuit boards. Therefore, the present invention reduces the production cost of an electronic product because the test can be performed without manufacturing special fixtures, and the invention improves space application as it saves a storing space of the special fixture.

The invention has been described in detail in connection with the preferred embodiment. This embodiment, however, is merely for example only and the invention is not restricted thereto. It will be easily understood by those skilled in the art that other variations and modifications can easily be made within the scope of this invention as defined by the appended claims.

What is claimed is:

1. A method for testing an internal circuit, said method comprising the steps of:

a) storing in a control means reference values and set allowable values for a plurality of electronic components to be tested;

b) judging whether or not computer aided design data, including component information data and component position data for the electronic components installed in a printed circuit board, are stored in the control means;

c) when the computer aided design data is judged to be stored in the control means in said step b), positioning tester pins of a multi-fixture in an electronic component to be tested using the component position data of the computer aided design data, and judging a point where a solder pointer of the printed circuit board and a measuring pointer of the multi-fixture cross each other;

d) when the computer aided design data is not judged to be stored in the control means in said step b), calculating the pressure of each pointer in the printed circuit board, and judging which section is a solder of the printed circuit board and which section is a lead of the electronic component according to whether the calculated pressure is relatively high or low;

e) storing a first measured pointer data according to the point judged in said step c) where the solder pointer of the printed circuit board and the measured pointer of the multi-fixture cross each other, storing a second measured pointer data according to the section judged in said step d) to be the solder of the printed circuit board, and storing a third measured pointer data according to the section judged in said step d) to be the lead of the electronic component;

f) loading the first, second and third measured pointer data stored in the control means, and measuring the printed circuit board with the electronic components mounted thereon, in order to achieve a measurement result; and g) judging whether or not a total area of the printed circuit board is measured completely, when the total area of the printed circuit board is not measured completely, moving the multi-fixture into a next area of the printed circuit board, to return said step f), and when the total area of the printed circuit board is measured completely, comparing a measured result achieved in said step f) with the reference value corresponding to the electrical component being tested stored in the control means in step a), and judging whether or not the electronic component has degraded.

2. The method for testing an internal circuit as claimed in claim 1, wherein the computer aided design data includes the component information data, the component position data, pattern data, solder mask data for the electronic components.

3. The method for testing an internal circuit as claimed in claim 1, wherein the pressure of the lead of the electronic component is higher than that of the solder of the printed circuit board.

4. The method for testing an internal circuit as claimed in claim 1, wherein the step of measuring the printed circuit board with the electronic component mounted thereon in said step f), comprises the substeps of:

applying a measured reference voltage to the electronic component;

feedbacking the voltage passing through the electronic component; and comparing the feedbacked voltage with the corresponding reference value stored in the control means, and displaying whether or not the electronic component is good based on whether or not the feed backed voltage is at or above the permitted set value corresponding to the electric component being tested stored in the control means.

5. The method for testing an internal circuit as claimed in claim 4, wherein the measuring reference voltage is 2.5 volts and the feedbacked voltage is lower than the measuring reference voltage.

6. The method for testing an internal circuit as claimed in claim 4, wherein said step g) further comprises the substep of displaying a result of whether or not the electronic component has degraded after judging whether or not the electronic component has degraded.

7. A method of testing an internal circuit, said method comprising the steps of:

i) storing in a control means reference values and set allowable values for a plurality of electronic components to be tested;

ii) judging whether or not computer aided design data for the electronic components installed in a printed circuit board, including component information data, component position data indicating distances of the electronic components from a reference point on the printed circuit board in X and Y axial directions, pattern data, and solder mask data, are stored in the control means;

iii) when the computer aided design data are stored in the control means, positioning tester pins of a multi-fixture in an electronic component to be tested using the component position data of the computer aided design data, and judging a point where the solder pointer of the printed circuit board and a measuring pointer of the multi-fixture cross each other;

iv) when the computer aided design data is not stored in the control means, calculating first and second pressures of first and second measuring pointers respectively of a solder of the printed circuit board and a lead of the electronic component;

v) comparing the first pressure with the second pressure calculated in said step iv), and judging based on whether the first or the second pressure is relatively higher or lower, which section is the solder of the printed circuit board and which section is the lead of the electronic component;

vi) storing in the control means a first measuring pointer data according to the point judged in said step iii) where the solder pointer of the printed circuit board and the measuring pointer of the multi-fixture cross each other, a second measuring pointer data according to the solder of the printed circuit board, and a third measuring pointer data according to the section judged in said step iv) to be the lead of the electronic component;

vii) loading the first, second, and third measuring pointer data stored in the control means, and measuring the printed circuit board with the electronic components mounted thereon, in order to achieve a measurement result; and viii) judging whether or not a total area of the printed circuit board is measured completely, so that when the total area of the printed circuit board is not measured completely, moving the multi-fixture into a next area of the printed circuit board, to return to said step vii), and when the total area of the printed circuit board, to return to said step vii), and when the total area of the printed circuit board is measured completely, comparing a measured result achieved in said step vii) with the reference value of the corresponding electrical component being tested stored in the control means in said step i), and judging whether or not the electronic component has degraded and displaying information about a degraded state.

8. An apparatus for testing an internal circuit, said apparatus comprising:

a multi-fixture having a plurality of tester pins of the same size, uniformly spaced apart from each other, and movable along at least one printed circuit board on which at least one electronic component is mounted;

a motor for controlling the position of said multi-fixture relative to said circuit board and for moving said multi-fixture along said circuit board;

a first means for selecting a plurality of measuring modes, respectively relating to resistance, capacitance, inductance, and reactance for the electronic component, for applying a measuring reference voltage to the electronic component, and for outputting a voltage feedbacked from the at least one electronic component;

a second means, including at least one switch connected to the tester pins of said multi-fixture, for switching to apply the measuring reference voltage from said first means to the electronic component, and to apply a feedbacked voltage of the applied measuring reference voltage from the electronic component to said first means;

a pressure sensor for calculating which section is a solder of the printed circuit and which section is a lead of the electronic component;

a third means for storing reference values and set allowable values for a plurality of electronic components to be tested, for selectively storing computer aided design data having component information data and component position data of the electronic components, for controlling said first means so that said first means selects the measuring modes of the electronic components, for judging which section is the solder of the printed circuit board and which section is the lead of the electronic component according to whether the sensed pressure from said pressure sensor is relatively high or low, for using the judged measured pointers and controlling said first means so that said first means measures the electronic component, for comparing the resulting voltage values measured by said first means with the stored reference values to judge whether or not the electronic component has degraded based on whether the value is at or above the stored set allowable value, and for controlling a switching operation of said second means and an operation of said motor; and a displaying device for displaying the resulting measured data judged by said third means.

9. The apparatus for testing an internal circuit as claimed in claim 8, wherein said multi-fixture moves in X and Y axial directions so that said first means measures at least the dimension of the printed circuit board.

10. The apparatus for testing an internal circuit as claimed in claim 8, wherein said multi-fixture includes a plurality of springs positioned around the tester pins to absorb shocks when the tester pins contact the printed circuit board.

11. The apparatus for testing an internal circuit as claimed in claim 8, wherein the tester pins in said multi-fixture are comprised of a conductor.

12. The apparatus for testing an internal circuit as claimed in claim 8, wherein said motor includes a stepping motor that rotates at an angle in proportion to pulse numbers by applying a pulse signal as a pressure.

13. The apparatus for testing an internal circuit as claimed in claim 8, wherein said first means includes an analog-digital converter for converting the received feedbacked voltage from the electronic component into a digital value.

14. The apparatus for testing an internal circuit as claimed in claim 8, wherein said second means includes a relay.

15. The apparatus for testing an internal circuit as claimed in claim 8, wherein said second means is comprised of a complementary metal-oxide semiconductor transistor.

16. The apparatus for testing an internal circuit as claimed in claim 8, wherein said third means further includes a motor controlling section for controlling a speed of said motor using a motor controlling program.

17. The apparatus for testing an internal circuit as claimed in claim 8, wherein said displaying device includes a monitor.

18. An apparatus for testing an internal circuit, said apparatus comprises:

a multi-fixture having a plurality of tester pins of the same size, uniformly spaced apart from each other, a plurality of springs positioned around said tester pins to absorb a shock when the tester pins contact the printed circuit board, and movable along at least one printed circuit board, on which at least one electronic component is mounted;

a stepping motor for controlling the position of said multi-fixture for moving said multi-fixture along at least one printed circuit board;

a first means, including an analog-digital converter, for converting a received feedbacked voltage from the electronic component into a digital value, for selecting a plurality of measuring modes, respectively relating to resistance, capacitance, inductance, and reactance for the electronic component, for applying a measuring reference voltage to the electronic component, and for outputting a voltage feedbacked from the electronic component;

a second means having at least one switch connected to the tester pins of said multi-fixture for switching to apply the measuring reference voltage from said first means to the electronic component and to apply a feedbacked voltage of the applied measuring reference voltage from the electronic component to said first means;

a pressure sensor for calculating which section is a solder of the printed circuit and which section is a lead of the electronic component;

a third means for storing reference values and set allowable values for a plurality of electronic components to be tested, for selectively storing computer aided design data having component information data and component position data of the electronic components, for controlling said first means so that said first means selects the measuring modes of the electronic components, for judging which section is the solder of the printed circuit board and which section is the lead of the electronic component based on whether the sensed pressure from said pressure sensor is relatively high or low, for using the judged measured pointers and controlling said first means so that said first means measures the electronic component, for comparing the resulting voltage values measured by said first means with the stored reference values to judge whether or not the electronic component has degraded based on whether the value is at or above the stored set allowable value, said third means including a motor controlling section for operating said stepping motor, and for controlling a switching operation of said second means and the operation of said motor; and a monitor for displaying the resulting measured data judged by said third means.

19. The apparatus for testing an internal circuit as claimed in claim 18, wherein said multi-fixture moves in X and Y axial directions so that said first means measures at least the dimension of the printed circuit board, and wherein the tester pins in said multi-fixture are comprised of a conductor.

20. The apparatus for testing an internal circuit as claimed in claim 18, wherein said second means is comprised of a complementary metal-oxide semiconductor transistor.

* * * * *